United States Patent [19]

Morihara

[11] Patent Number: 5,404,038
[45] Date of Patent: Apr. 4, 1995

[54] SEMICONDUCTOR DEVICE AND MANUFACTURING METHOD THEREOF

[75] Inventor: Toshinori Morihara, Hyogo, Japan

[73] Assignee: Mitsubishi Denki Kabushiki Kaisha, Tokyo, Japan

[21] Appl. No.: 875,177

[22] Filed: Apr. 28, 1992

[30] Foreign Application Priority Data

May 10, 1991 [JP] Japan .................. 3-105718

[51] Int. Cl.⁶ .................. H01L 29/78; H01L 27/02
[52] U.S. Cl. .................. 257/329; 257/332; 257/334; 257/401
[58] Field of Search .............. 257/328, 329, 330, 331, 257/332, 334, 302, 296, 306, 401

[56] References Cited

U.S. PATENT DOCUMENTS 4,929,990  5/1990  Yoneda .................. 257/401

FOREIGN PATENT DOCUMENTS 3832414    6/1989  Germany ............... 257/302
61-285753 12/1986  Japan ................. 257/302
63-153864  6/1988  Japan ................. 257/329
1-61953    3/1989  Japan ................. 257/401

Primary Examiner—Jerome Jackson
Assistant Examiner—Donald L. Monin
Attorney, Agent, or Firm—Lowe, Price, LeBlanc & Becker

[57] ABSTRACT

A semiconductor device and a method of manufacturing thereof has an opening of circular or oval columnar configuration in an active layer where a gate electrode is formed in self-alignment in a sidewall-spacer manner. The channel region has a curved surface so that a relatively large area can be ensured where the width of a gate electrode is constant to suppress the increase of threshold voltage due to narrow channel effect in accordance with miniaturization. Therefore, a vertical type MOS field effect transistor can be formed without degradation in transistor characteristic in accordance with miniaturization.

8 Claims, 22 Drawing Sheets

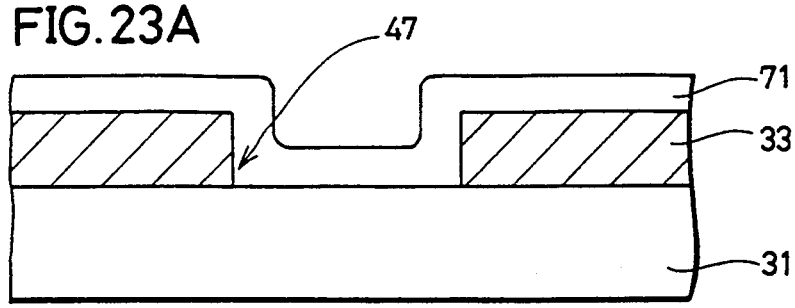
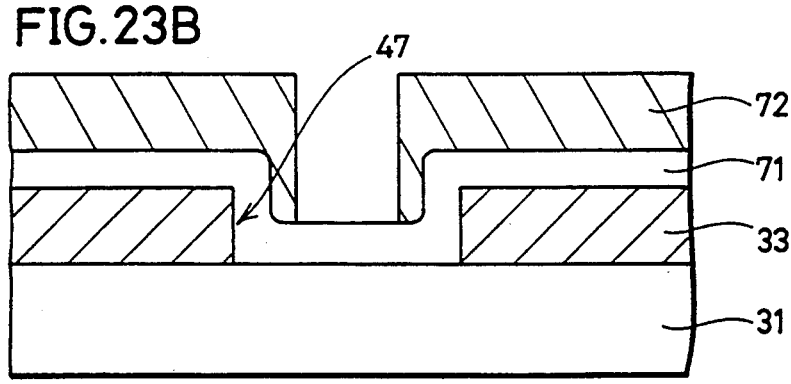
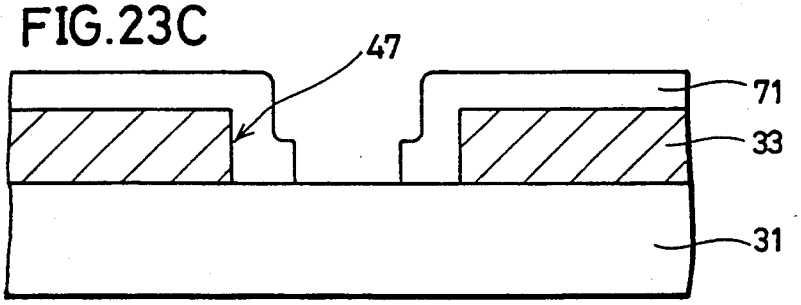
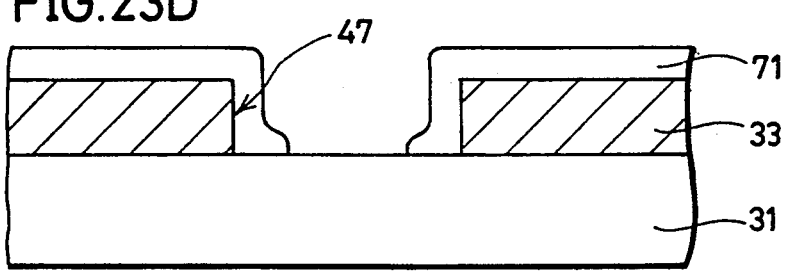

SEMICONDUCTOR DEVICE AND MANUFACTURING METHOD THEREOF

BACKGROUND OF THE INVENTION

1. Field of the Invention

The present invention relates to semiconductor devices and a method of manufacturing thereof, and more particularly to the structure of a vertical type MOS (Metal Oxide Semiconductor) device having a gate electrode formed in the step portion of an active layer pattern formed by epitaxial growth on a semiconductor substrate and a method of manufacturing thereof.

2. Description of the Background Art

In accordance with the increase in integration density of MOS type semiconductor integrated circuit devices, the channel length of a MOS type field effect transistor implementing the device is significantly reduced. Also, the channel width (transistor width) has become smaller.

A method of manufacturing a conventional MOS type field effect transistor will be explained hereinafter with reference to FIGS. 19A–19C.

An element isolation region 2 is formed by the so-called LOCOS (Local Oxidation of Silicon) method on the main surface of a p type semiconductor substrate 1. Then, an oxide film 3a is formed by thermal oxidation on an active region surrounded by element isolation region 2. A polycrystalline, silicon film 4a having impurities doped and then an oxide film 5a are deposited by CVD (Chemical Vapor Deposition) method all over semiconductor substrate 1, followed by the patterning of a resist film 6 (FIG. 19A).

Etching is applied anisotropically with resist film 6 as a mask to pattern a gate insulation film 3, a gate electrode 4, and an insulation layer 5. Using gate electrode 4 and insulation layer 5 as a mask, n type impurities are implanted to form an impurity layer 7 of low concentration (FIG. 19B).

An oxide film is deposited all over semiconductor substrate 1 by the CVD method, whereby etching is applied anisotropically to form a side wall spacer 8 at the sides of gate electrode 4 and insulation layer 5. Then, n type impurities are implanted with insulation layer 5 and side wall spacer 8 as a mask to form an impurity layer 9 of high concentration (FIG. 19C).

If the channel length of such a MOS type field effect transistor formed in the above-described manner is reduced drastically, the generation of hot electrons becomes significant due to the intensive electric field between the source and drain. These hot electrons are introduced and accumulated in the gate insulation film so that the characteristic is degraded. Thus, there is a problem in a MOS type integrated circuit device implemented with a MOS type field effect transistor of the conventional planar structure that increase in integration density is limited due to the tradeoff between the minimum channel length and degradation in transistor characteristic.

There was also another problem that the current capacity (conductance) of the transistor is decreased due to reduction in the channel width.

A vertical type MOS field effect transistor is proposed where a projection pattern of monocrystalline silicon is formed on the main surface of the silicon substrate with the side of the projection serving as a channel region for achieving sufficient channel length without characteristic degradation even when the area of the transistor is drastically reduced in accordance with the increased scale of integration of a MOS type integrated circuit device.

A conventional method of manufacturing such a vertical type MOS field effect transistor will be described hereinafter with reference to FIGS. 20A–20F.

An insulation film 12 of silicon dioxide, for example, is formed to a thickness of approximately 0.5–2 μm on a p type silicon substrate 11. A rectangular opening 13 with a dimension of approximately 3 μm for one side is formed corresponding to the drain region of each transistor in insulation film 12 by photolithography. Using a mixed gas of, for example, dichlorosilane of the source gas of the silicon, hydrochloric acid of reaction gas, and hydrogen of carrier gas, a monocrystalline silicon layer 104 is grown to a thickness of approximately 0.5–2 μm which is substantially equal to that of insulation film 12 within opening 13 of insulation film 12 on the face of the exposed silicon substrate 11 by the conventional selective epitaxial growth technique of silicon where dichlorosilane is thermal decomposed at a temperature of approximately 1100°–1200° C. (FIG. 20A).

Insulation film 12 is then dissolved by wet etching to form a monocrystalline silicon projection pattern 14 of 0.5–2 μm in height on the surface of silicon substrate 1 (FIG. 20B).

A gate insulation film 15 is formed over the surface of monocrystalline silicon projection pattern 14 and over the exposed face of silicon substrate 11. Then, a polycrystalline silicon layer 106 is formed on silicon substrate 11 by vapor growth, to which impurities of n type, for example, are implanted thereto (FIG. 20C).

Next, polycrystalline silicon layer 106 is etched until the surface of gate insulation film 15 is exposed by conventional reactive ion etching process to form a gate electrode 16. The etching is further continued till the exposed gate insulation film 15 is removed (FIG. 20D).

A through oxide film 17 is formed on the silicon exposed surface, whereby n type impurities of high concentration are ion-implanted therethrough with gate electrode 16 as a mask. The implanted ions are subjected to activation process to form an n+ type drain region 18 on the surface of monocrystalline silicon projection pattern 14 and an n+ type source region 19 at the surface of silicon substrate 11 (FIG. 20E).

Through oxide film 17 is then removed in a conventional manner and an oxide film 20 for impurity blocking is formed on the silicon exposed surface. An interlayer insulation film 21 is then formed on the semiconductor substrate with a contact hole 22 therein for drain region 18. Next a drain interconnection 23 is formed extending over contact hole 22 and interlayer insulation film 21 (FIG. 20F). A plane layout diagram of the structure of FIG. 7F is shown in FIG. 21.

The above-described manufacturing method is described, in Japanese Patent Laying-Open No. 63-153864, for example, where the surface layer including the side face of the monocrystalline silicon projection pattern is applied with thermal oxidation, followed by eliminating the formed thermal oxide film for eliminating the growth defect generated in the side face of the monocrystalline silicon projection pattern.

Because a vertical type MOS field effect transistor formed by the above-described manufacturing steps has a silicon epitaxial film of rectangular shape on the silicon substrate, there was a problem that the threshold voltage is increased (narrow channel effect) due to the width of the gate electrode formed in the step portion becoming smaller according to a more minute pattern in larger scale integration.

The narrow channel effect is a phenomenon where the absolute value of the threshold voltage becomes higher by reduction in the channel width in a direction perpendicular to the direction of the channel length. The cause will be described hereinafter with reference to FIGS. 22A and 22B.

When the ratio of the width of channel region 103 (w in the figure) sandwiched by element isolation regions 102 formed on the surface of silicon substrate 101 to the depth of channel region 103 receiving effect of an electric field from gate electrode 103 (d in the figure), i.e. w/d, is relatively great as shown in FIG. 22A, the magnitude of region $s_2$ located below element isolation region 102 is negligibly small with respect to the region $s_1$ right beneath the active region surrounded by element isolation region 102 out of the region affected by the gate voltage applied to gate electrode 104. This means that the threshold voltage is independent of the influence of region $s_2$ and depends upon the magnitude of region $s_1$. When w/d is relatively small as shown in FIG. 22B, the magnitude of region $s_2$ is relatively great with respect to the magnitude of region $s_1$ and cannot be neglected. Therefore, the gate voltage required to invert the conductivity type of region $s_1$ is greater in the case of FIG. 22B than in the case of FIG. 22A, resulting in a higher threshold voltage.

There was also a problem that the pattern of the rectangular shape easily approximates a circular shape so that a rectangular pattern conforming to the former design is hard to obtain due to diffraction effect of light used in the lithography step of forming the pattern of a silicon epitaxial film in accordance with miniaturization.

SUMMARY OF THE INVENTION

An object of the present invention is to provide a semiconductor device including a MOS type field effect transistor of high integration density that has the increase of threshold voltage due to narrow channel effect suppressed, and a method of manufacturing thereof.

In order to attain the above object, a semiconductor memory device of the present invention includes a source region having a boundary, a drain region having a boundary substantially parallel to the boundary of the source region, a channel region defined in a region between each of the boundaries, and a gate electrode formed on the surface of the channel region with a field insulation film thereunder. Each of the boundaries extends in a curved or bent manner in a plane parallel to the plane of the channel region.

According to this structure, the channel region per se extends in a curved or bent manner in the width direction thereof. Therefore, a channel width can be ensured greater than that of a channel region formed linearly in the width direction. As a result, increase in threshold voltage caused by narrow channel effect can be suppressed.

More specifically, a semiconductor device of the present invention includes an element isolation region on the main surface of a semiconductor substrate surrounding an active region to isolate the same from other regions, and an active layer of a semiconductor film of a predetermined thickness formed having an opening with an inner sidewall of a curved surface to expose the main surface of the semiconductor substrate in the region including the active layer. A gate electrode is formed at the lower corner of the inner sidewall of the opening with a gate insulation film therebetween. An impurity layer which becomes the source/drain region is formed in the main surface of the semiconductor substrate within the opening and in the respective active regions of the surface of the active layer.

Because the semiconductor device has a structure where the opening in the active layer is formed with an inner sidewall of a curved surface, the inner surface of the opening where a gate electrode is formed, i.e. the channel surface, is accordingly curved. Since a larger channel width is ensured in comparison with the case where the surface is a plane, increase in threshold voltage caused by narrow channel effect can be suppressed.

The opening in the active layer is preferably formed in a circular or oval columnar configuration. This columnar-shaped opening has the advantage of facilitating patterning in miniaturization. Furthermore, an oval columnar-shaped opening allows a greater curvature of the inner sidewall where the gate electrode is formed than in the case of a circular columnar-shaped opening. This results in a greater channel width to further suppress the narrow channel effect.

A method of manufacturing a semiconductor device of the present invention patterns an oxide film of circular or oval columnar shape having predetermined plane configuration and thickness on the main face of a semiconductor substrate. Using this oxide film as a mask, an active layer of a semiconductor film is grown in an epitaxial manner on the main surface of the semiconductor substrate. The oxide film is then removed to form an opening having an inner sidewall of a curved surface. An element isolation region is formed in the region surrounding the active layer at the main surface of the semiconductor substrate where the opening is formed and at the main surface of the active layer. A gate oxide film is formed by thermal oxidation all over the surface where the semiconductor substrate is exposed. A polysilicon film is then deposited on this gate oxide film. Anisotropic etching is applied to the polysilicon film to form a gate electrode at the sidewall within the active region in the opening. An oxide film is deposited all over the semiconductor substrate, whereby anisotropic etching is applied to form an insulation layer covering the gate electrode. Using this insulation layer as a mask, impurities are implanted on the surface of the active layer and on the main surface of the semiconductor substrate in the opening to form an impurity layer.

According to the method of manufacturing the semiconductor device of the present invention, formation can be carried out effectively of an active layer having an opening with an inner sidewall of a curved surface and of a gate electrode in self-alignment at the inner sidewall of the opening.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2A and 2B are sectional views of the memory cell of FIGS. 1A-1C showing a first step of the manufacturing method thereof, in which FIG. 2A and FIG. 2B are taken along lines C—C and B—B of FIG. 1B, respectively.

FIGS. 3A and 3B are sectional views of the memory cell of FIGS. 1A-1C showing a second step of the manufacturing method thereof, in which FIGS. 3A and 3B are taken along lines C—C and B—B of FIG. 1B, respectively.

FIGS. 4A-4C are views of the memory cell of FIGS. 1A-1C showing a third step of the manufacturing method thereof, in which FIGS. 4A and 4B are taken along lines C—C and B—B of the FIG. 1B, respectively, and FIG. 4C shows a plan view.

FIGS. 5A and 5B are sectional views of the memory cell of FIGS. 1A-1C showing a fourth step of the manufacturing method thereof, in which FIGS. 5A and 5B are taken along lines C—C and B—B of FIG. 1B, respectively.

FIGS. 6A and 6B are sectional views of the memory cell of the FIGS. 1A-1C showing a fifth step of the manufacturing method thereof, in which FIGS. 6A and 6B are taken along lines C—C and B—B of FIG. 1B.

FIGS. 7A and 7B are sectional views of the memory cells of FIGS. 1A-1C showing a sixth step of the manufacturing method thereof, in which FIGS. 7A and 7B are taken along lines C—C and B—B of the FIG. 1B, respectively.

FIGS. 10A and 10B are sectional views of the memory cell of FIGS. 1A-1C showing a seventh step of the manufacturing method thereof, in which FIGS. 10A and 10B are taken along lines C—C and B—B of FIG. 1B, respectively.

FIGS. 11A and 11B are sectional views of the memory cell of FIGS. 1A-1c showing an eighth step of the manufacturing method thereof, in which FIGS. 11A and 11B are taken along lines C—C and B—B of FIG. 1B, respectively.

FIGS. 12A and 12B are sectional views of the memory cell of FIGS. 1A-1C showing a ninth step of the manufacturing method thereof, in which FIGS. 12A and 12B are taken along lines C—C and B—B of the FIG. 1B, respectively.

FIGS. 20A-20F are sectional views of a conventional vertical type MOS field effect transistor showing the manufacturing steps thereof, wherein FIG. 20F is taken along line A-A of FIG. 21.

FIG. 22 is a sectional view of a memory cell for describing the cause of narrow channel effect, where

FIGS. 23A-23D are sectional views corresponding to the section taken along line B—B of FIG. 1B showing the manufacturing process of a seventh embodiment of the present invention.

DESCRIPTION OF THE PREFERRED EMBODIMENTS

A first embodiment of the present invention will be explained hereinafter with reference to FIGS. 1A-1C and FIGS. 2A-2B.

Figure 1A:
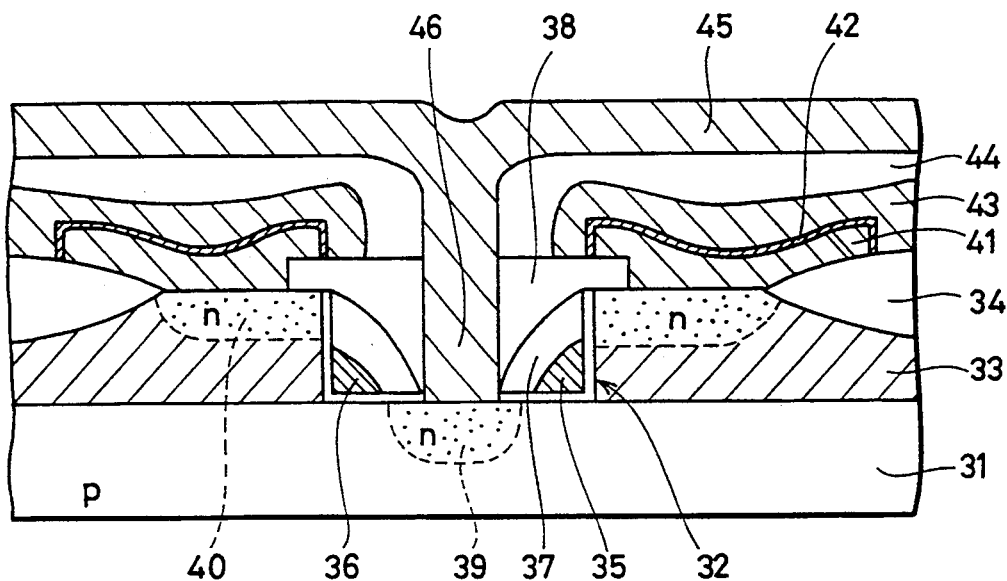
FIG. 1A is a sectional view of a structure of a DRAM memory cell taken along line B—B of FIG. 1B according to an embodiment of the present invention.
Figure 1B:
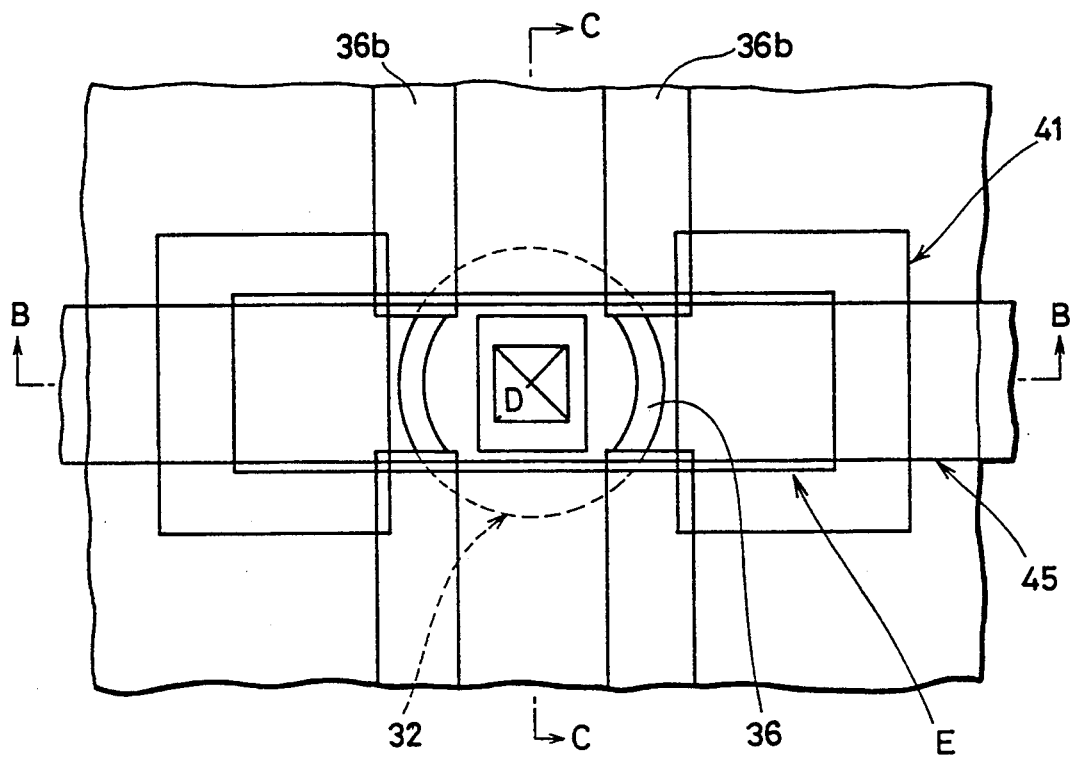
FIG. 1B is a plan layout diagram of FIG. 1A.
Figure 1C:
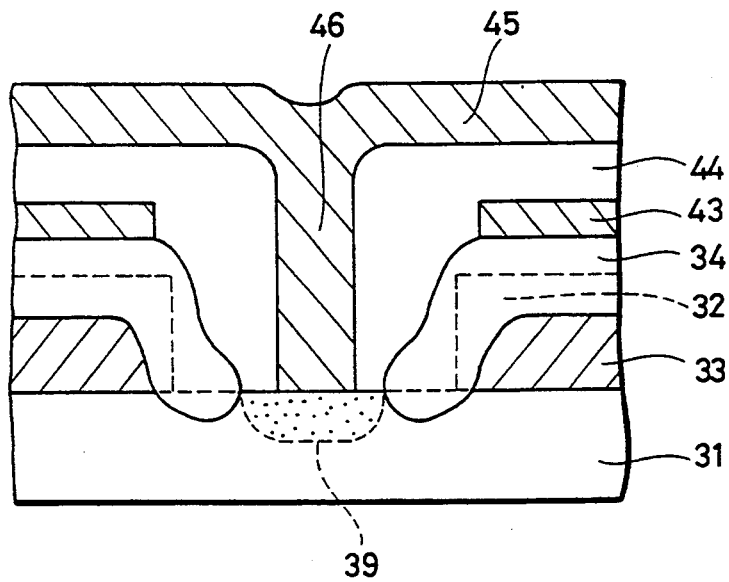
FIG. 1C is a sectional view of the memory cell of FIG. 1A taken along line C—C of FIG. 1B.

Referring to FIGS. 1A-1C, a semiconductor device of the present embodiment has an active layer 33 of monocrystalline silicon epitaxial film with a cylindrical opening 32 formed on the surface of a p type silicon substrate 31. An element isolation region 34 is formed at the surface of activation layer 33 and at the surface including the internal of opening 32 surrounding an active region (the region indicated by arrow F in FIG. 1B). (See FIG. 1C.) A sidewall spacer-like gate electrode 36 of polysilicon having impurities doped is formed at the lower portion of the inner wall of opening 32 on the active region in opening 32 with a gate insulation film 35 thereunder. The surface of gate electrode 36 is covered with a sidewall spacer-like insulation film 37. The surface of insulation film 37 is covered with an insulation film 38.

An impurity layer 39 of n type is formed at the surface of silicon substrate 31 at the bottom of opening 32. An impurity layer 40 of n type is formed at the surface of active layer 33. These impurity layers 39 and 40 implement the source/drain region of the transistor.

A storage node 41 of polycrystalline silicon having impurities doped is formed in junction with the surface of impurity layer 40. A cell plate 43 is formed thereupon with a capacitor insulation film 42 therebetween. Storage node 41 and cell plate 43 form the capacitor of a memory cell. Cell plate 43 is covered with an insulation film 44. A bit line 45 of a conductive layer such as aluminum is patterned over insulation film 44. Bit line 45 is electrically connected to impurity layer 39 at the bottom of contact hole 46.

The embodiment of manufacturing a DRAM memory cell of the above-described structure will be explained hereinafter with reference to FIGS. 2A-12B.

Figure 2A:
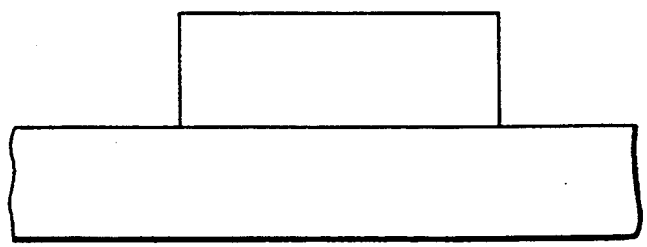
Figure 2B:
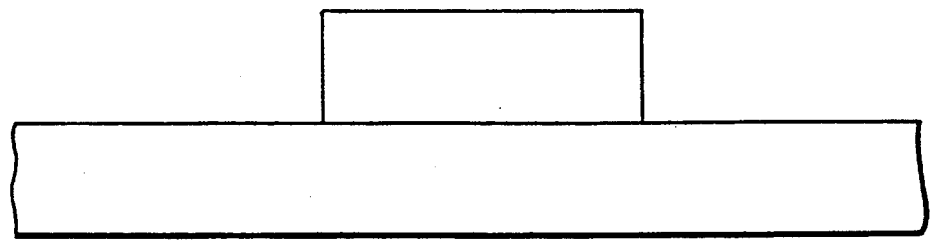

An oxide film of approximately 2000 Å in thickness is deposited on silicon substrate 31 by the CVD method, for example. This oxide film is subjected to photolithography and etching, resulting in a cylindrical oxide film 47 (FIG. 2A, 2B).

Figure 3A:
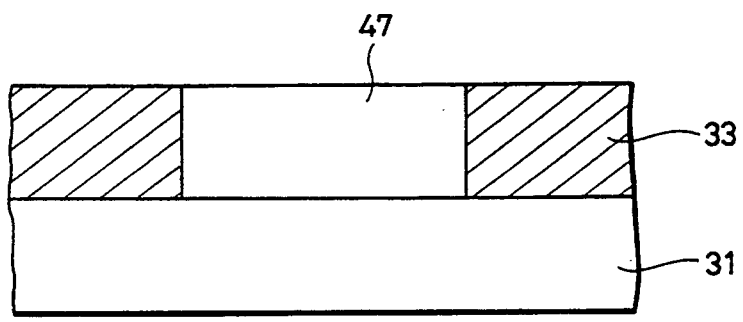
Figure 3B:
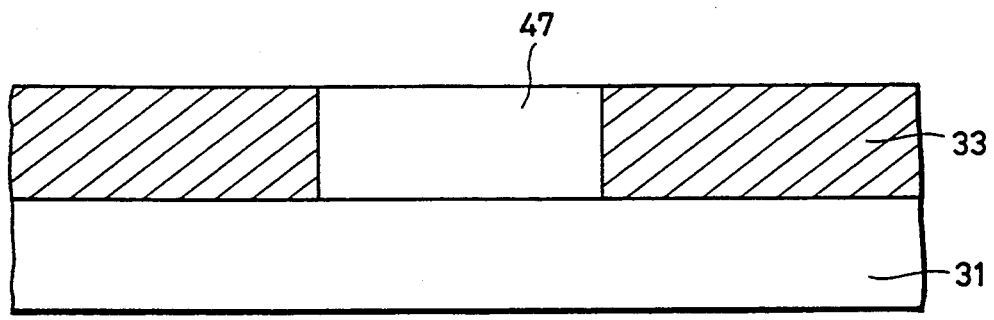
Figure 4A:
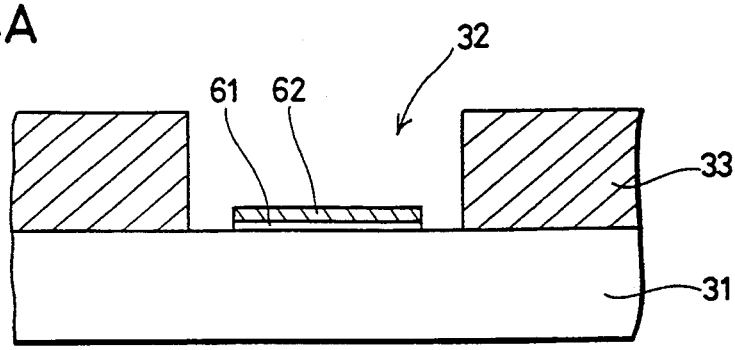
Figure 4B:
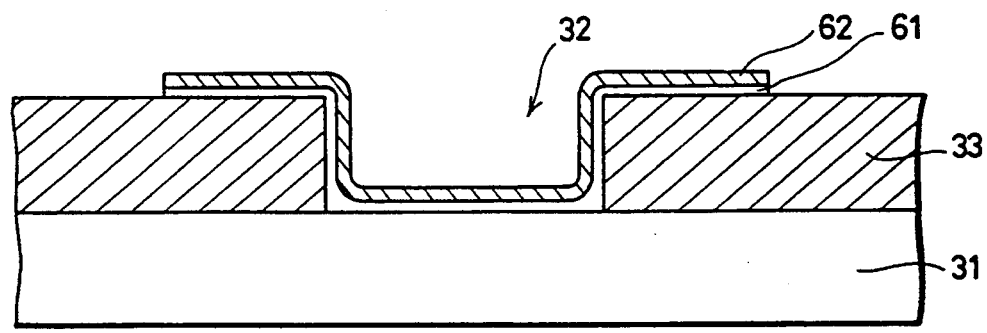
Figure 4C:
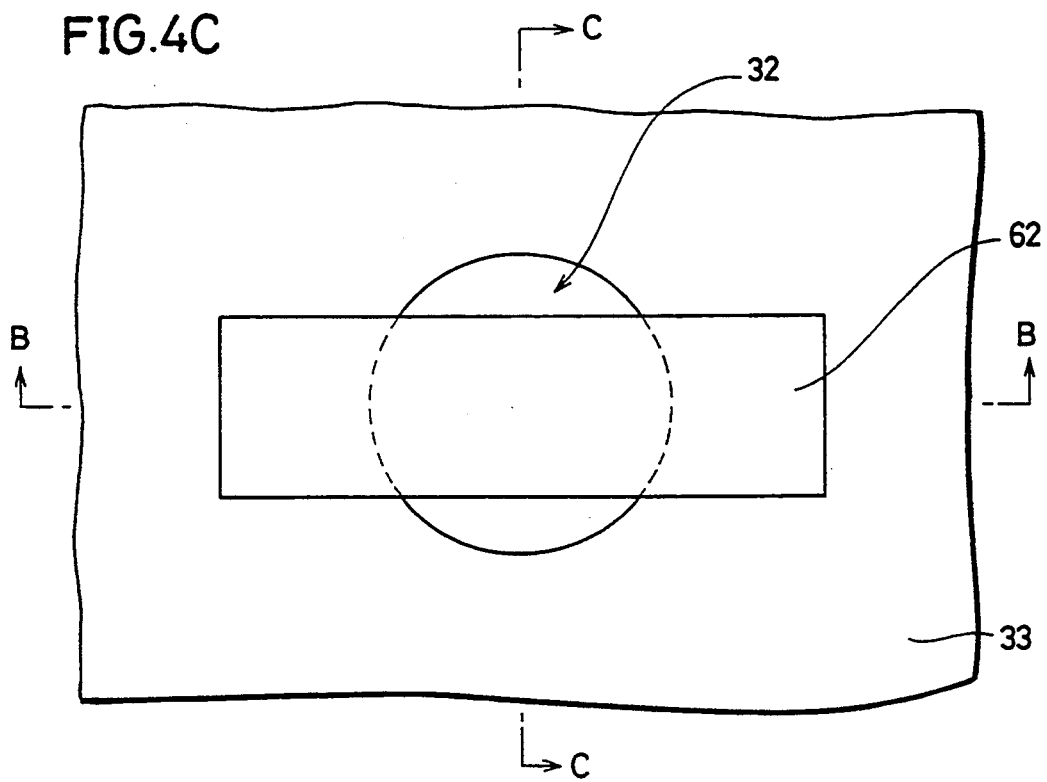
Figure 5A:
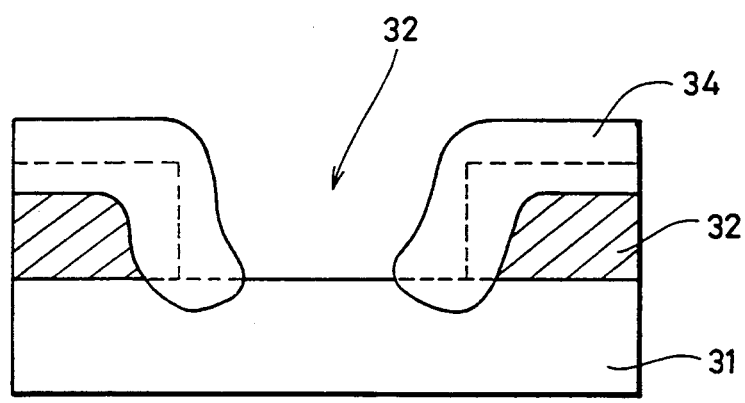
Figure 5B:
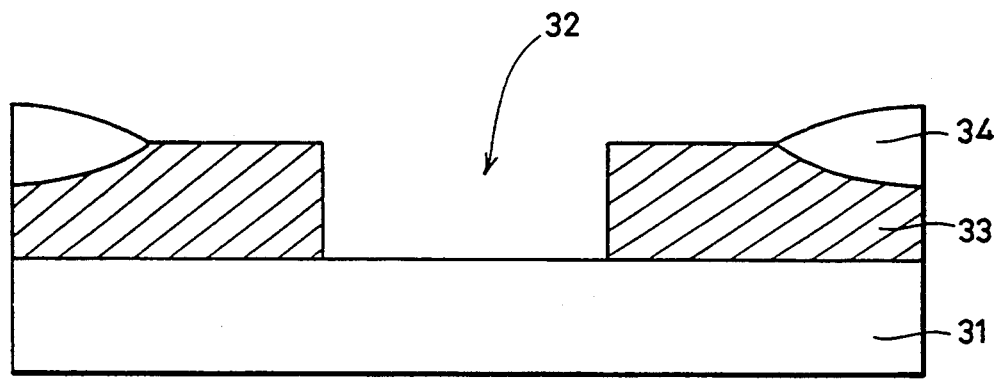

Using oxide film 47 as a mask, a monocrystalline silicon epitaxial layer 33 is formed to a thickness of approximately 2000 Å on silicon substrate 31 by the CVD method, for example (FIG. 3A, 3B). Oxide film 47 is then completely removed by etching with, for example, hydrofluoric acid.

Next, element isolation region 34 is formed in the region excluding the active region by LOCOS method. In this process, a thermal oxide film 61 of approximately 400 Å thickness is formed all over the surface of silicon substrate 31 including the internal face of opening 32 after oxide film 47 has been removed. Silicon nitride film 62 of approximately 1000 Å thickness is formed on thermal oxide film 61. Patterning is carried out by photolithography and etching so that silicon nitride film 62 and thermal oxide film 61 cover only the region which becomes the active region, resulting in the structure shown in FIGS. 4A–4C. Then, thermal oxidation is applied to form element isolation region 34 of a thermal oxide film on monocrystalline silicon epitaxial film 33 and silicon substrate 31 which are not covered by nitride film 62. Then, thermal oxide film 61 and nitride film 62 are removed to result in the sectional structure shown in FIGS. 5A and 5B.

Figure 6A:
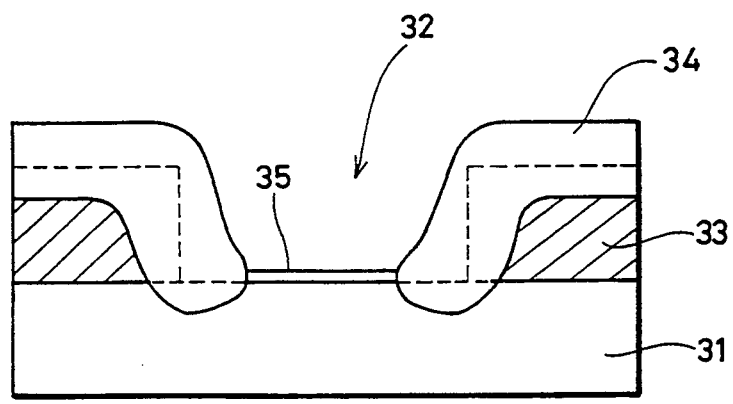
Figure 6B:
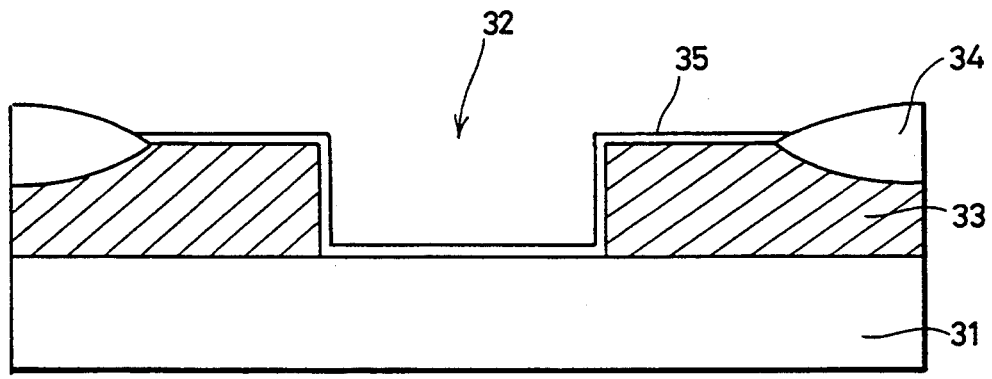

Next, thermal oxidation is applied to form gate insulation film 35 to a thickness of approximately 150 Å at the surface of the active region including the internal of opening 32 (FIGS. 6A and 6B).

Figure 7A:
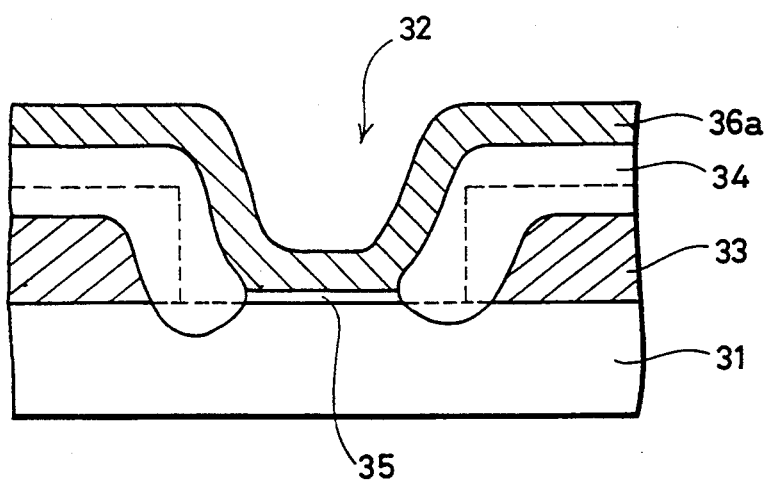
Figure 7B:
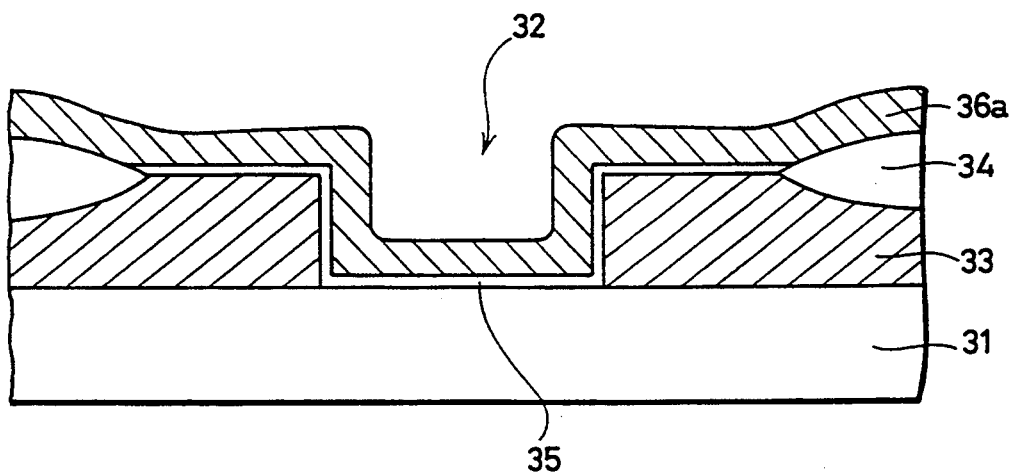
Figure 8:
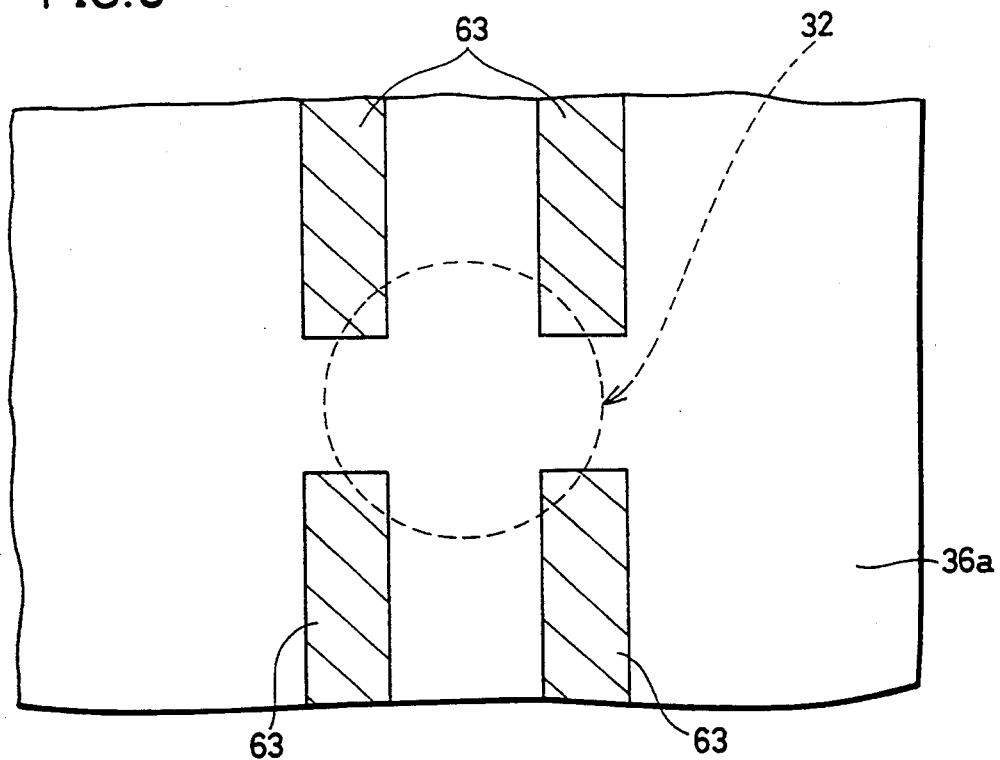
FIG. 8 is a plan view showing the pattern configuration of resist mask 63 in the step of FIGS. 7A and 7B.
Figure 9:
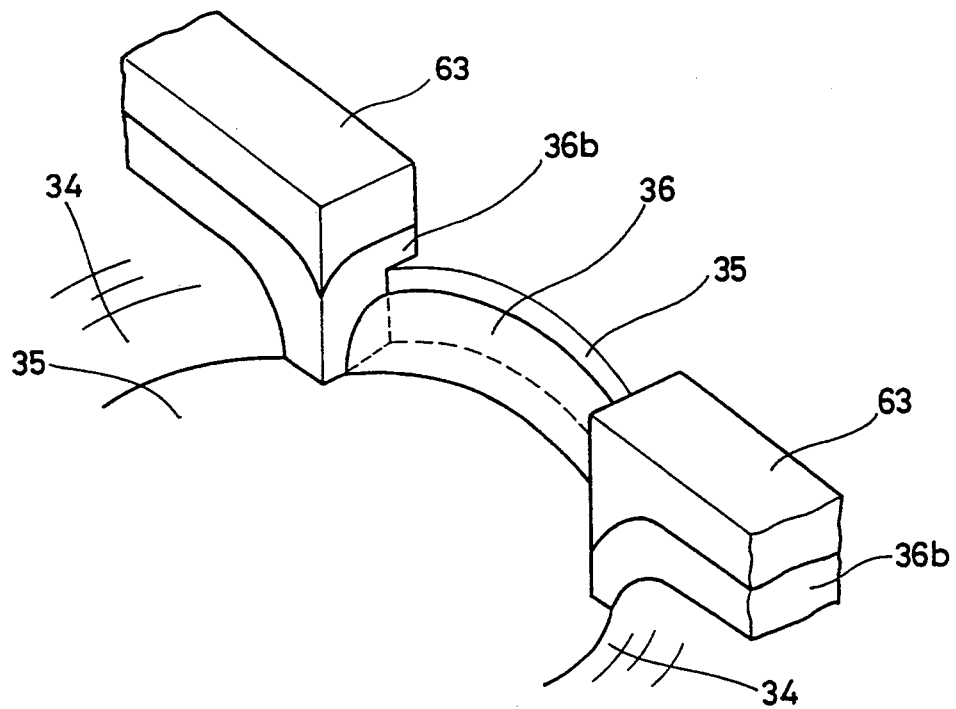
FIG. 9 is a perspective view of a memory cell for describing the configuration of gate electrode 36 and word line 36b after being subjected to anisotropic etching in the step of FIGS. 7A and 7B.
Figure 10A:
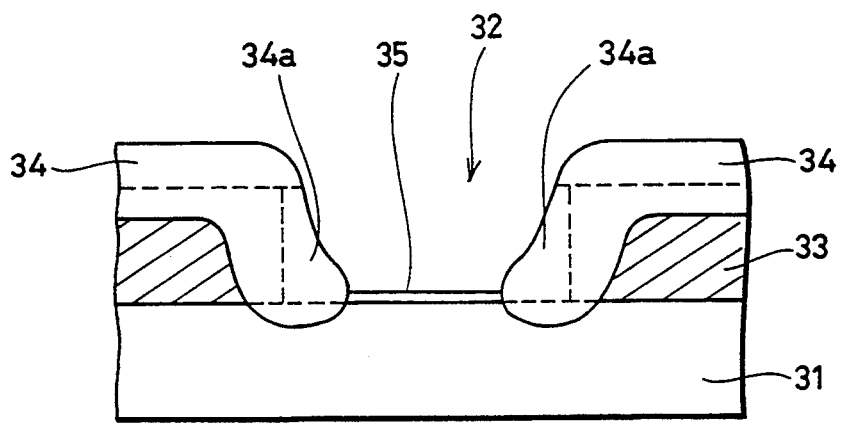
Figure 10B:
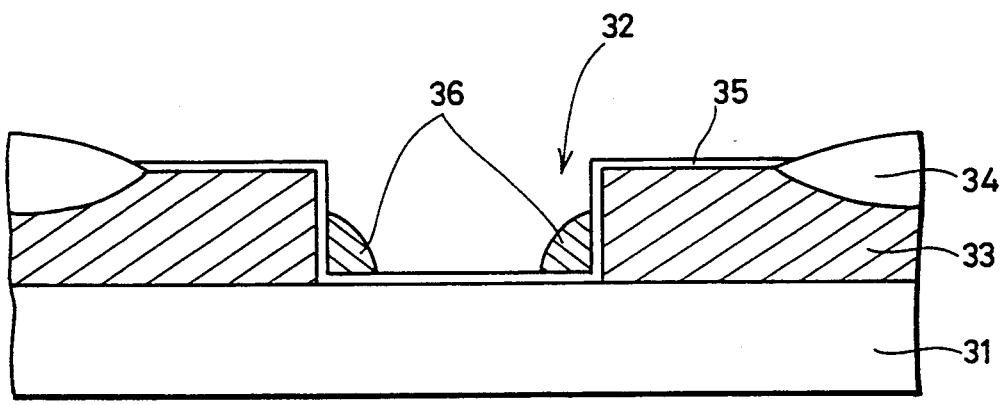

Polysilicon film 36a is formed to a thickness of approximately 2000 Å all over silicon substrate 31 (FIGS. 7A, 7B). The sidewall spacer-like gate electrode 36 is formed at the sidewall of opening 32 of active layer 33 in self-alignment by anisotropic etching. In this anisotropic etching, resist mask 63 having a pattern shown in FIG. 9 is formed to leave polysilicon film 36a which becomes word line 36 (refer to FIG. 10B). The proximity of gate electrode 36 after anisotropic etching is shown in a perspective manner in FIG. 9. A sectional view thereof is shown in FIG. 10A and 10B.

When anisotropic etching for gate electrode 36 formation is completed, all the polysilicon film 36a excluding gate electrodes 36 and word line 36b must be removed. For this purpose, the portion 34a (FIG. 11A) of element isolation region 34 extending into opening 32 must have a smooth surface with an appropriate slope. This slope of portion 34a can be realized by controlling the thermal treatment temperature at the time of element isolation region 34 formation by a LOCOS method. More specifically, a smooth slanted surface can be obtained with a LOCOS method by applying thermal oxidation process in a gas for oxidation of a temperature of at least 1000 Å to soften the thermal oxide film. It is possible to control the slant in portion 34a in opening 32 of element isolation region 34 by adjusting appropriately the thermal oxidation temperature.

Figure 11A:
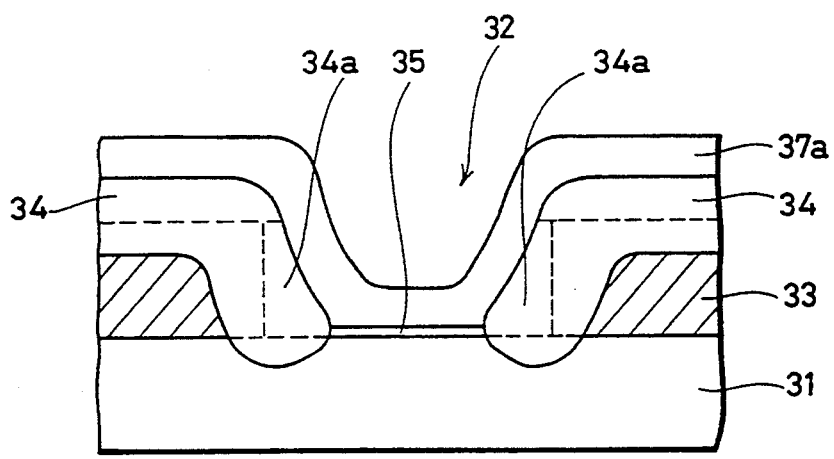
Figure 11B:
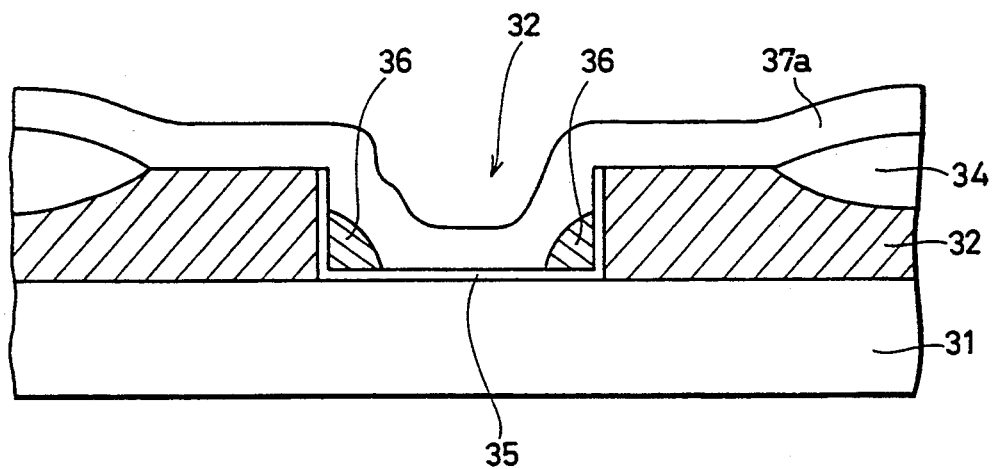
Figure 12A:
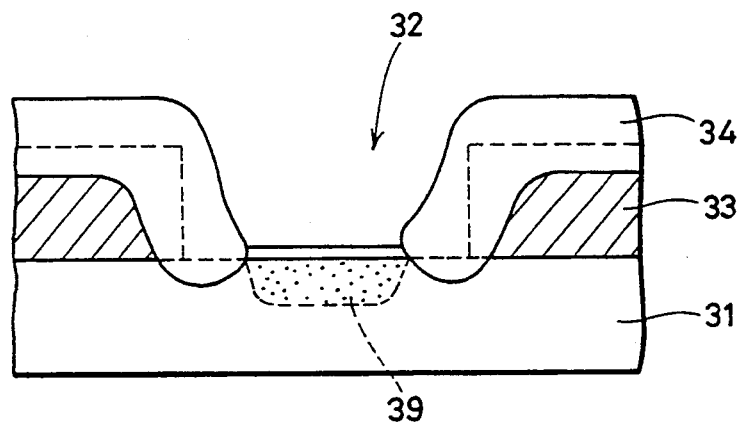
Figure 12B:
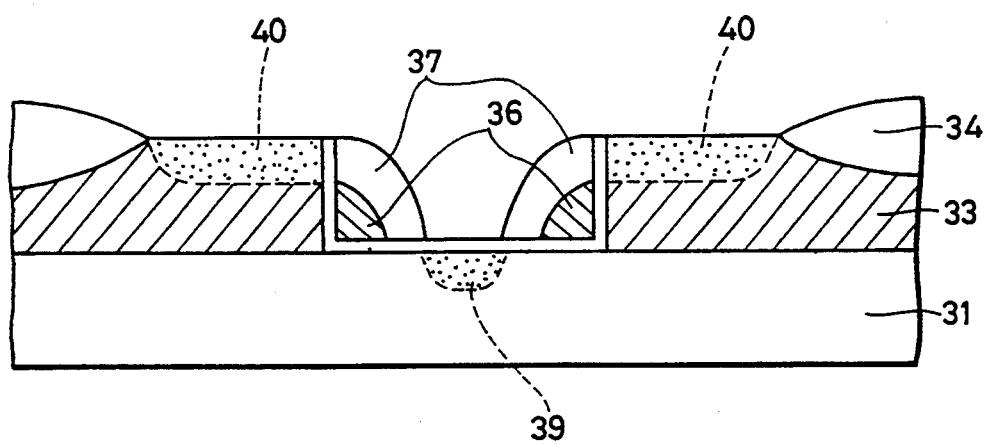

Then, oxide film 37a is deposited to a thickness of approximately 2000 Å by the CVD method, for example, on the whole surface of silicon substrate 31 (FIGS. 11A, 11B). Anisotropic etching is applied to oxide film 37a to form sidewall spacer-like insulation film 37. Using insulation film 37 and element isolation region 34 as a mask, impurity regions 39 and 40 that serve as the source/drain regions of the MOS transistor are formed (FIGS. 12A, 12B).

The DRAM memory cell of the present embodiment has gate electrode 36 formed in self-alignment at the corner in opening 32 so that the structure of the minute gate portion can be implemented without the need of critical resist mask patterning. The inner sidewall of opening 32 where gate electrode 36 is formed has a curved surface owing to the cylindrical configuration of opening 32. This means that a larger contact area between gate electrode 36 and active layer 33 can be ensured with an inner sidewall of opening 32 having a curved surface in comparison with the case of a plane surface if the width of gate electrode 36 is constant. Therefore, increase in threshold voltage due to narrow channel effect can be suppressed.

The present embodiment has an advantage that a cylindrical opening 32 can easily be patterned conforming to the former design in the patterning step of oxide film 47 for forming opening 32, where in conventional cases the corner portion thereof was rounded due to the effect of light diffraction at the time of exposure by lithography even if the configuration was designed to be rectangular in shape.

Figure 13:
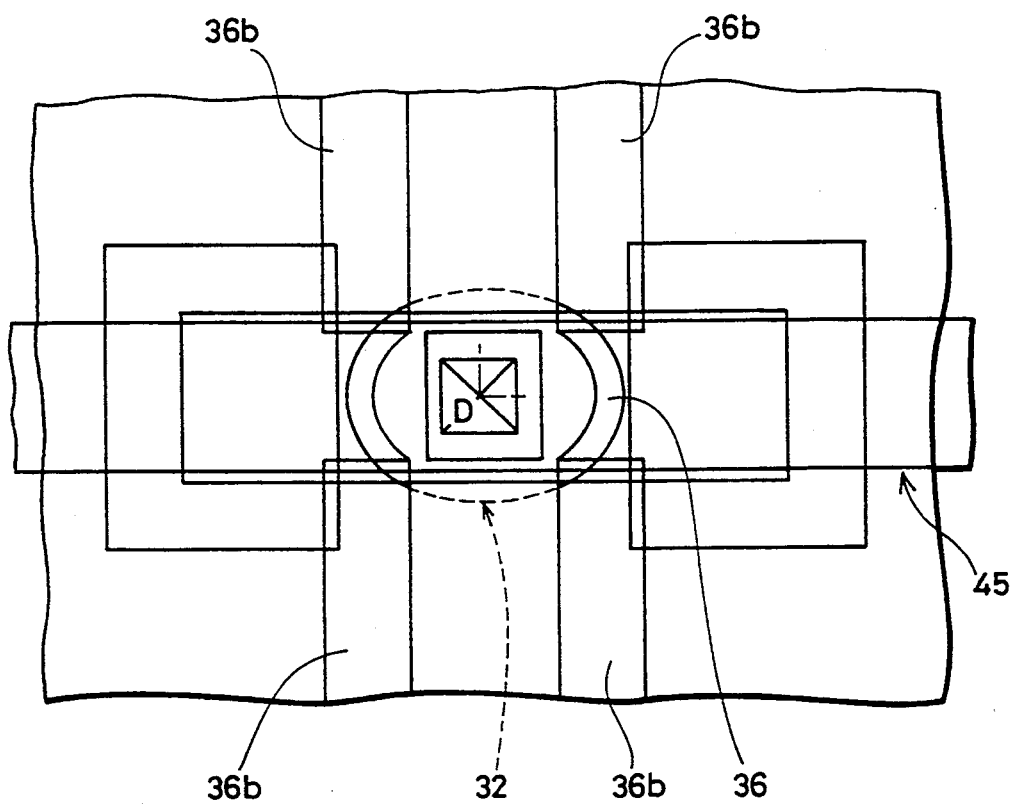
FIG. 13 is a plan layout diagram showing a structure of a memory cell according to a second embodiment of the present invention.

A second embodiment of the present invention will be explained hereinafter with reference to FIGS. 13. The DRAM memory cell of the present embodiment differs from that of the first embodiment in having an opening 32 of an oval columnar shape. In the present embodiment, gate electrode 36 is formed at the lower portion of the inner sidewall of opening 32 where the curvature is at its maximum.

The curvature of the inner sidewall of opening 32 where gate electrode 36 is to be formed can be increased owing to the structure of the present embodiment in comparison with the case of a circular columnar shape opening 32. Therefore, the above-described narrow channel effect suppression is further improved.

Figure 14:
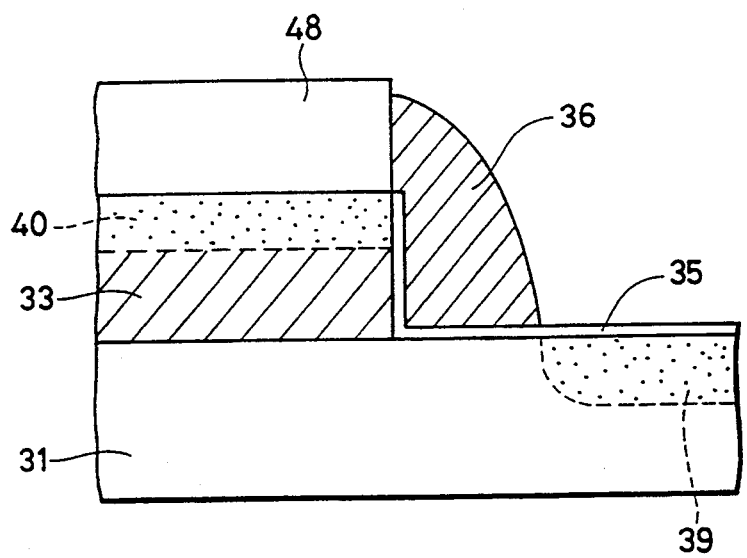
FIG. 14 is an enlarged sectional view of the main part of a memory cell according to a third embodiment of the present invention.

A third embodiment of the present invention will be explained hereinafter with reference to FIG. 14.

The DRAM memory cell of the present embodiment has active layer 33 of a monocrystalline silicon epitaxial film formed on silicon substrate 31, insulation film 48 formed thereupon, and sidewall spacer-like gate electrode 36 formed in self alignment at the side walls of active layer 33 and insulation film 48.

The present embodiment has an advantage that gate electrode 36 can be formed with an adequate height without the necessity of forming a thick active layer 33 of monocrystalline silicon epitaxial film which generally requires some time period for formation. In the present embodiment, gate electrode 36 may be formed to have a height as high as the sum of the thicknesses of active layer 33 and insulation film 48.

Figure 15:
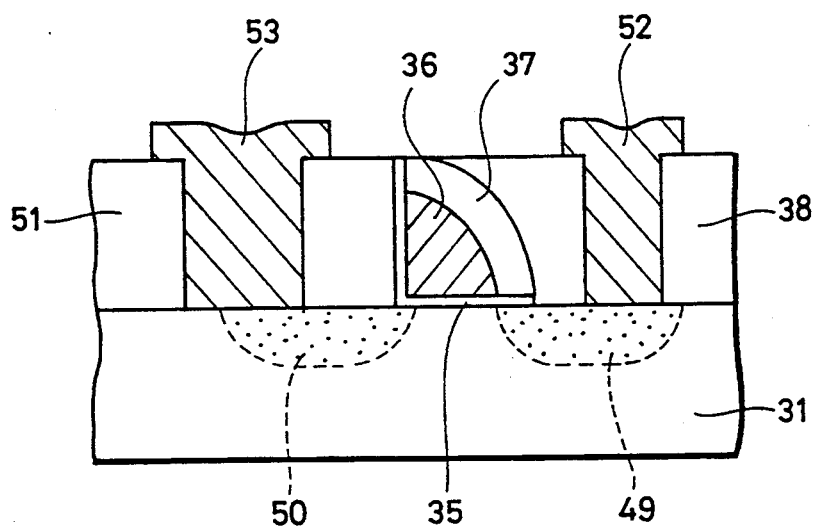
FIG. 15 is an enlarged sectional view of the main part of a memory cell according to a fourth embodiment of the present invention.

A fourth embodiment of the present invention will be explained hereinafter with reference to FIG. 15.

The structure of the present embodiment has the sidewall spacer-like gate electrode 36 formed at the sidewall of only insulation film 51, and not at the sidewall of active layer 33. Impurity layers 49 and 50 which become the source/drain regions are formed at the surface of silicon substrate 31 at a position sandwiching gate electrode 36. Impurity layer 49 is connected to an electrode terminal 52 at a contact hole provided in insulation film 38. Impurity layer 50 is connected to an electrode terminal 53 in a contact hole provided in insulation film 51.

In the present embodiment, the channel length is reduced since the perpendicular sidewall of gate electrode 36 does not serve as the channel region. However the channel region located at the surface of silicon substrate 31 right beneath the bottom of gate electrode 36 is curved in the direction of the width (a direction at right angles to the paper plane of FIG. 15) to have a substantially great channel width, resulting in suppressing the narrow channel effect.

Figure 16:
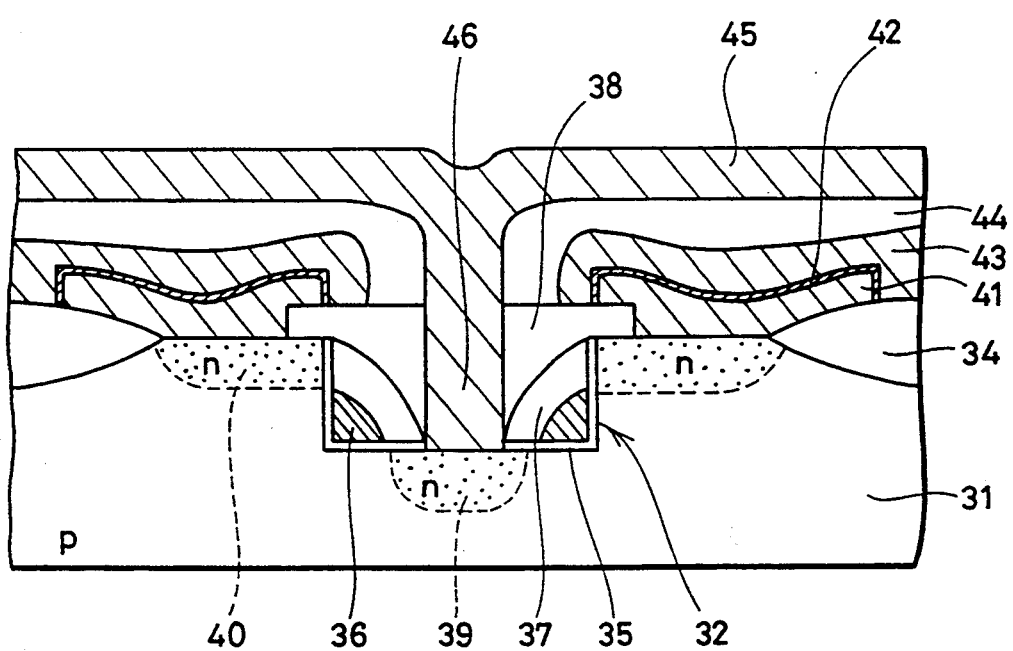
FIG. 16 is a sectional view of a memory cell according to a fifth embodiment of the present invention.

A fifth embodiment of the present invention will be described hereinafter with reference to FIG. 16. The present embodiment has opening 32 formed directly in the surface of silicon substrate 31, in comparison with the aforementioned first embodiment where opening 32 is provided in active layer 33 formed of monocrystalline silicon epitaxial film. Because an opening is directly formed in silicon substrate 31, the present embodiment has an advantage that an opening 32 of relatively small diameter can easily be formed by selective etching with simple manufacturing steps.

Figure 17A:
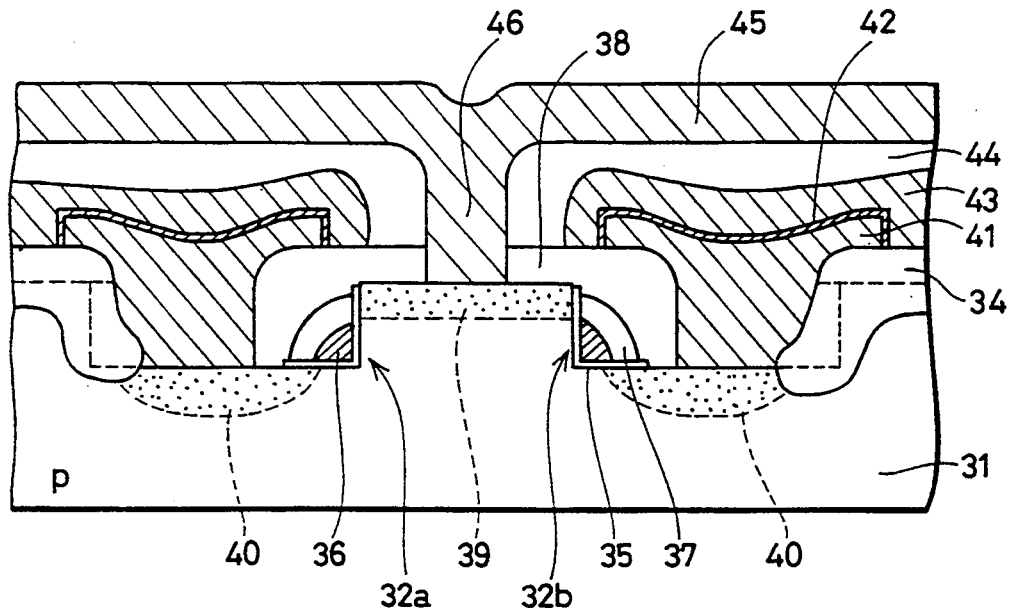
FIG. 17A is a sectional view of a memory cell according to a sixth embodiment of the present invention taken along line B—B of FIG. 17B.
Figure 17B:
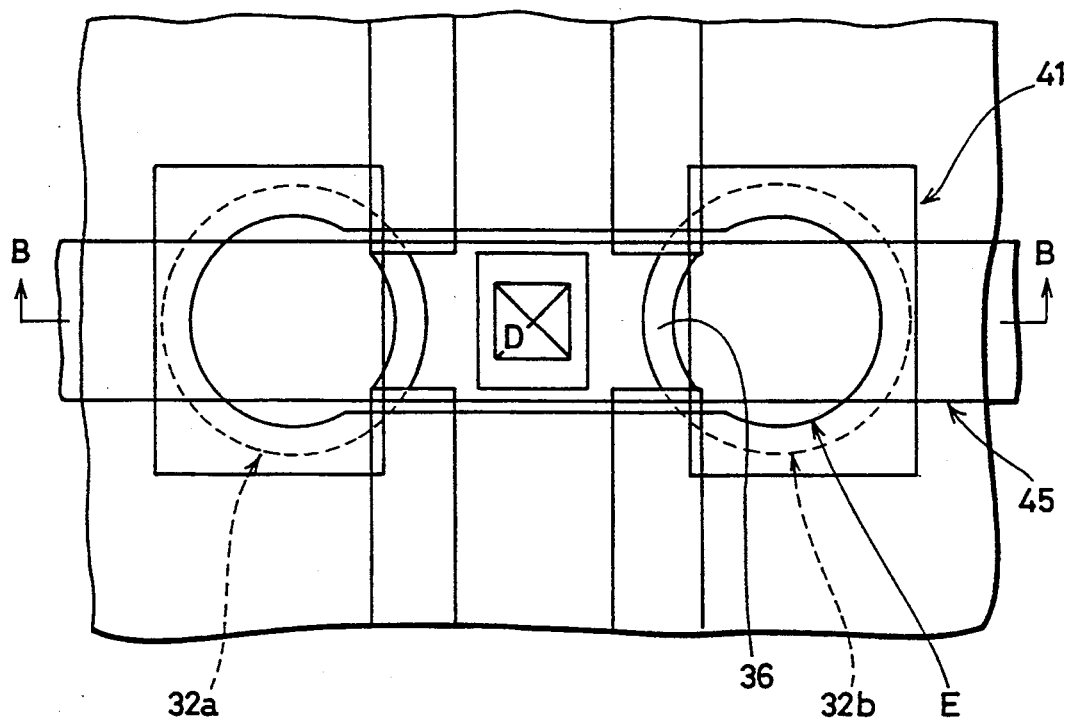
FIG. 17B is a plan view of the memory cell of FIG. 17A.

A sixth embodiment of the present invention will be described with reference to FIGS. 17A and 17B. The present embodiment has two openings 32a and 32b of a predetermined diameter formed at the surface of silicon substrate 31 by photolithography and etching, where the bottom of openings 32a and 32b and the region on silicon substrate 31 between openings 32a and 32b serve as the active region (the region indicated by arrow E in FIG. 17B). The present embodiment has impurity layer 39 which becomes the source/drain region formed at the surface of silicon substrate 31, and impurity layer 40 formed at the bottom of openings 32a and 32b. The direction of the curve of gate electrode 36 is opposite to that of the first embodiment. However, a substantial increase in the width of the channel region by the curve in gate electrode 36 is similar to that of the first embodiment. Therefore, the present embodiment also has an advantage of preventing narrow channel effect as in the first embodiment.

Figure 18A:
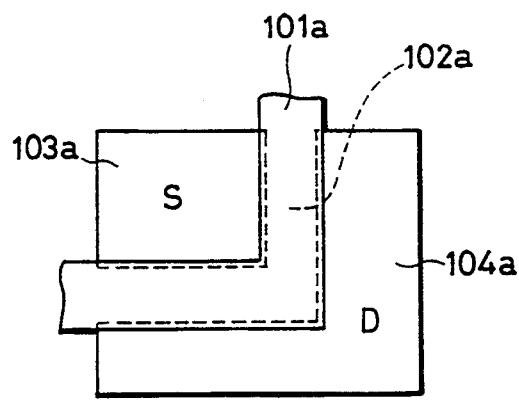
FIGS. 18A-18D are plan views of the channel region of the present invention schematically showing various modifications thereof.
Figure 18B:
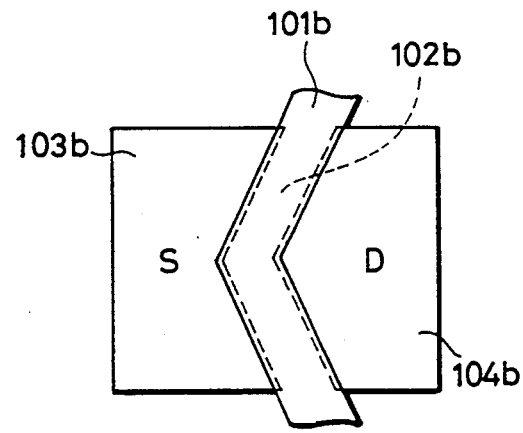
Figure 18C:
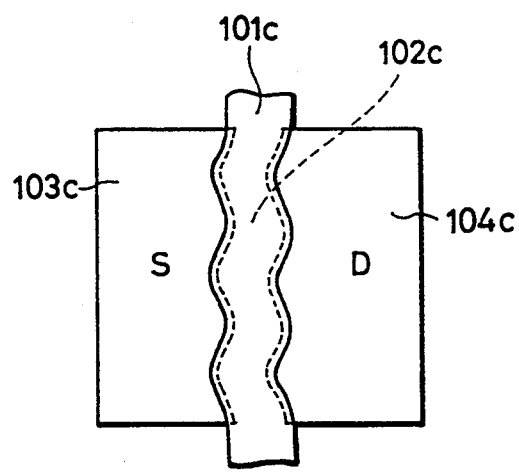
Figure 18D:
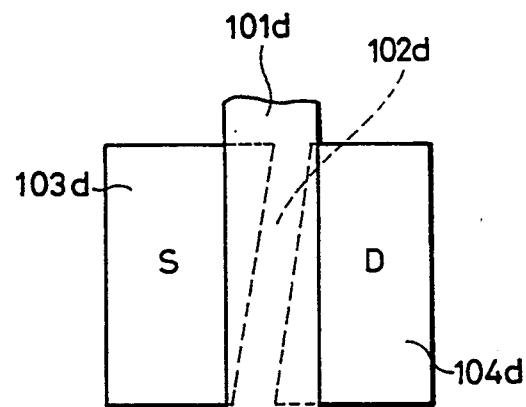
Figure 19A:
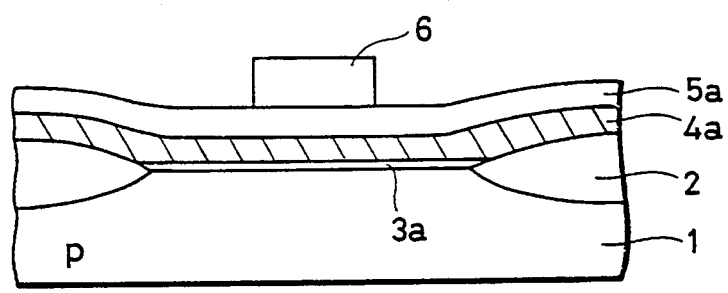
FIGS. 19A-19C are sectional views of a conventional MOS type field effect transistor showing the manufacturing steps thereof.
Figure 19B:
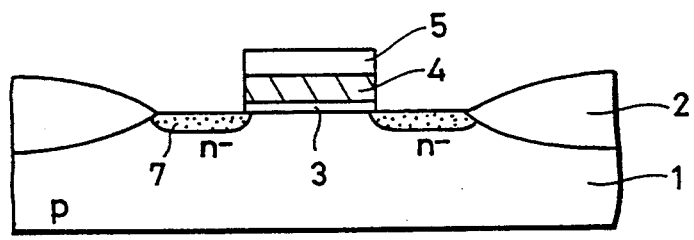
Figure 19C:
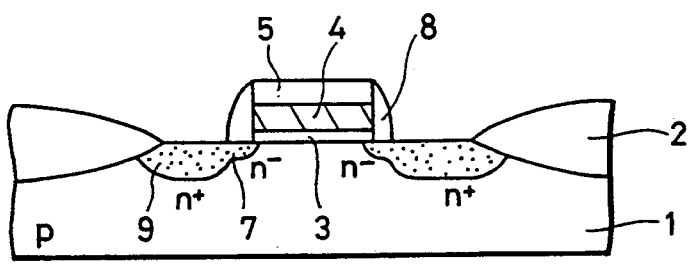
Figure 20A:
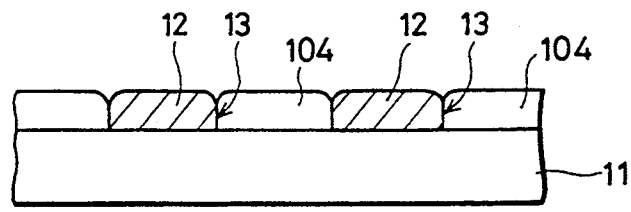
Figure 20B:
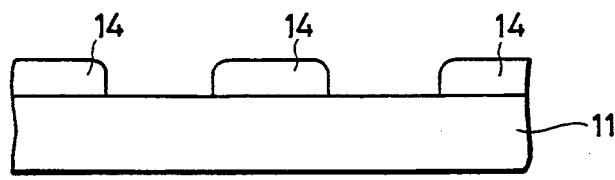
Figure 20C:
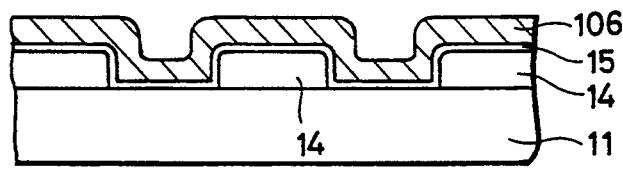
Figure 20D:
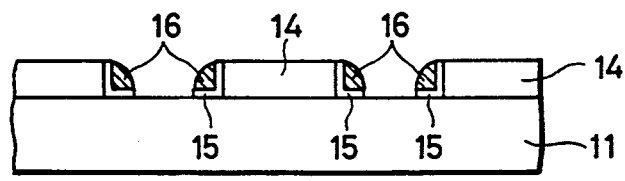
Figure 20E:
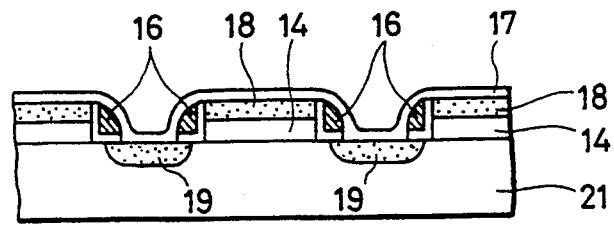
Figure 20F:
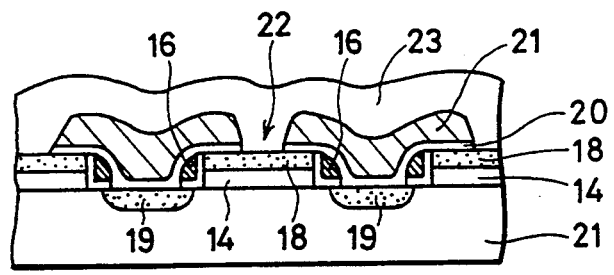
Figure 21:
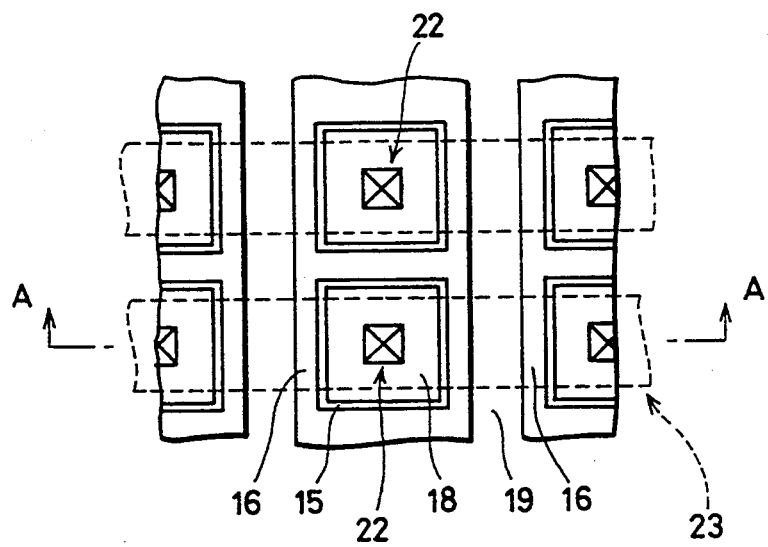
FIG. 21 is a plane layout diagram of the structure of FIG. 20F.
Figure 22A:
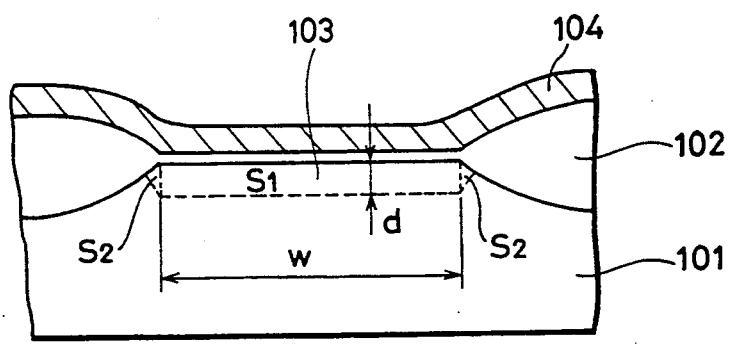
FIGS. 22A and FIG. 22B show the cases where the ratio of channel width w to channel depth d are great and small, respectively.
Figure 22B:
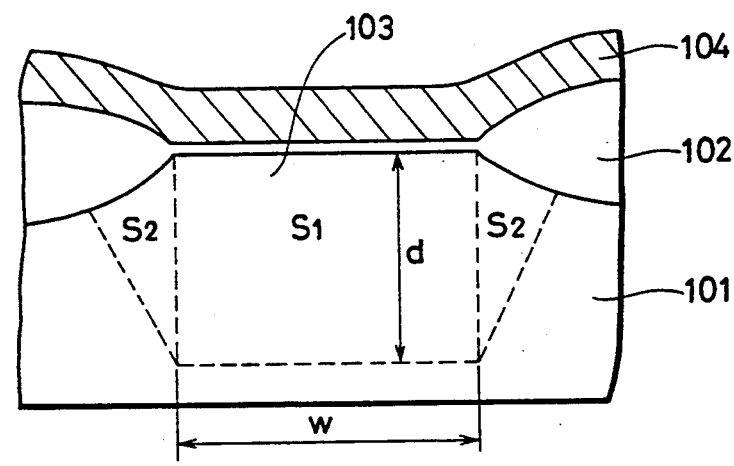

FIGS. 18A-18D show various modifications of the channel region viewed in a plan manner for ensuring a greater channel width. The planar configuration of a channel region for achieving the object of the present invention is not limited to the circular or oval curve as in the above-described embodiments. As shown in FIGS. 18A and 18B, channel regions 102a and 102b formed right beneath gate electrodes 101a and 101b, respectively, may be rigidly bent and have source regions 103a and 103b and drain regions 104a and 104b formed respectively on opposite sides. Also, as shown in FIG. 18C, a parallel serpentine configuration may be taken to have source region 103c and drain region 104c formed on opposite sides. Furthermore, as shown in FIG. 18D, channel region 102d may cross the active region in a slanted manner with respect to the extending direction of gate electrode 101d with source region 103d and drain region 104d formed on opposite sides. This configuration results in a substantially greater channel width in comparison with the case where channel region 102d crosses the active region orthogonally. Modifications of the channel region in the planar configuration results in the advantage of narrow channel effect suppression.

A seventh embodiment of the present invention will be described with reference to FIGS. 23A-23D and FIGS. 24A-24D. In the present embodiment, the element isolation region 34 is formed by CVD method and etching, although it is formed through thermal oxidation by LOCOS method in the above described other embodiments.

Figure 24A:
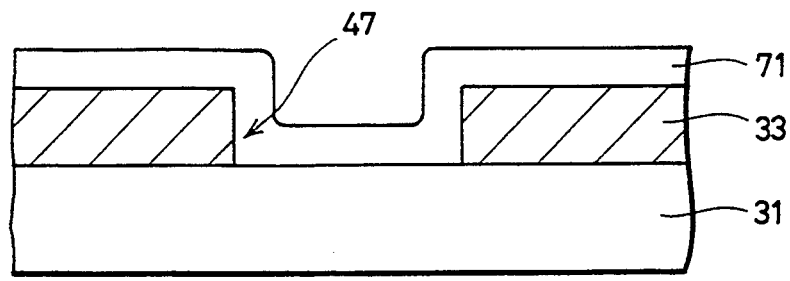
FIGS. 24A-24D are sectional views corresponding to the section taken along line C—C of FIG. 1B showing the manufacturing process of the seventh embodiment of the present invention.
Figure 24B:
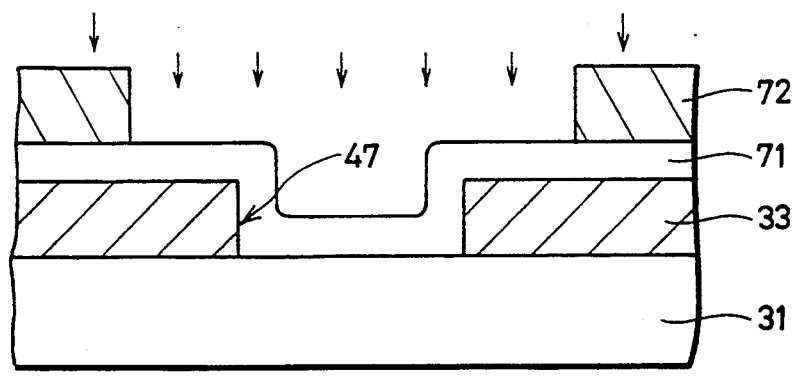

In the present embodiment, after forming active layer 33 having opening 47 on silicon substrate 31 as shown in FIGS. 3A and 3B, a silicon oxide film 71 with a thickness of 500 Å–5000 Å is deposited by CVD method all over silicon substrate 31 including on the inner surface of opening 47, as shown in FIGS. 23A and 24A. Then, with reference to FIGS. 23B and 24B, a resist film 72 having a prescribed pattern is formed by lithography on the surface of silicon oxide film 71 so that a region which is to be an element isolation region is covered thereby.

Figure 24C:
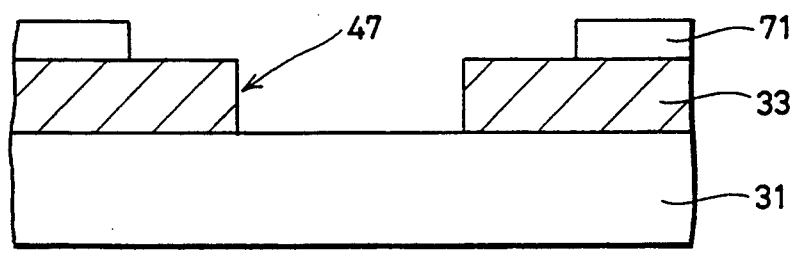
Figure 24D:
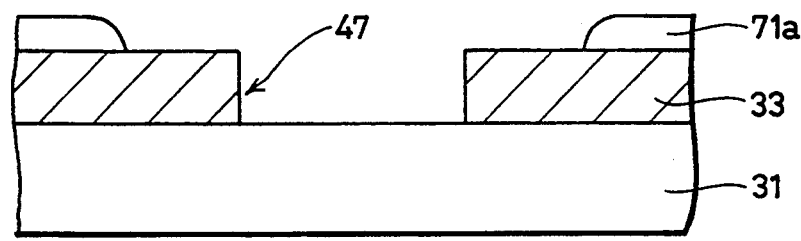

Next, using resist film 72 as a mask, silicon oxide film 71 is selectively removed by anisotropical etching (see to FIGS. 23C and 24C). Then, after removing resist film 72, an element isolation film 71a having a smoothly curved surface is formed by performing wet etching to the surface of remaining silicon oxide film 71.

The present embodiment of forming element isolation film 71a by CVD and etching has a feature that it is easier to form a fine pattern and to control the configuration of element isolation film 71a than a method including thermal oxidation process such as LOCOS method.

Thus, according to the above-described embodiments of the present invention, the formation of a curved or bent channel region will result in a curved channel region surface to ensure a larger effective width of the channel region where the width of the gate electrode is constant. This results in the suppression of increase in threshold voltage due to narrow channel effect, and degradation of transistor characteristic according to miniaturization is prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A vertical semiconductor device comprising:
   a source/drain region having a boundary;
   a drain/source region above, and having a boundary parallel to the boundary of the source/drain region;
   a channel region defined between the parallel boundaries of the source/drain and drain/source regions;
   a gate electrode formed on the channel region with an insulation film interposed therebetween,
   wherein the parallel boundaries of the source/drain and drain/source regions are curved.

2. The semiconductor device according to claim 1, wherein the effective width of the channel region conforms to the non-linearity of the parallel boundaries of the source/drain and drain/source regions.

3. The semiconductor device according to claim 1, wherein a surface of the gate electrode has opposite sides adjacent to each other on a top portion conforming to the non-linearity of the source/drain and drain/source regions.

4. The semiconductor device according to claim 1, wherein the parallel boundaries of the source/drain and drain/source regions are curved in a plane parallel to a surface of the channel region.

5. The semiconductor device according to claim 1, wherein the parallel boundaries of the source/drain and drain/source regions are folded in a plane parallel to a surface of the channel and drain/source regions.

6. A semiconductor device comprising:
   a semiconductor layer having a top surface, a bottom surface, and a trench with an inner curved sidewall formed therein to a prescribed depth;

an impurity layer formed at the bottom surface of the trench which becomes the source/drain region;

an impurity layer formed at the top surface of the semiconductor layer which becomes the drain/source region; and a gate electrode formed at the bottom of the inner sidewall of the trench with a gate insulation film therebetween, wherein the trench is of a circular columnar configuration.

7. A semiconductor device comprising:

a semiconductor layer having a top surface, a bottom surface, and a trench with an inner curved sidewall formed therein to a prescribed depth;

an impurity layer formed at the bottom surface of the trench which becomes the source/drain region;

an impurity layer formed at the top surface of the semiconductor layer which becomes the drain/source region; and a gate electrode formed at the bottom of the inner sidewall of the trench with a gate insulation film therebetween, wherein the trench is of an oval columnar configuration having a major axis.

8. The semiconductor device according to claim 7, wherein the direction of a major axis of the oval section of the trench is substantially orthogonal to the gate electrode.

* * * * *